(12) United States Patent
Hynecek

(10) Patent No.: US 10,141,356 B2
(45) Date of Patent: Nov. 27, 2018

(54) IMAGE SENSOR PIXELS HAVING DUAL GATE CHARGE TRANSFERRING TRANSISTORS

(71) Applicant: SEMICONDUCTOR COMPONENTS INDUSTRIES, LLC, Phoenix, AZ (US)

(72) Inventor: Jaroslav Hynecek, Allen, TX (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 65 days.

(21) Appl. No.: 15/095,918

(22) Filed: Apr. 11, 2016

(65) Prior Publication Data

US 2017/0111603 A1 Apr. 20, 2017

Related U.S. Application Data

(60) Provisional application No. 62/241,862, filed on Oct. 15, 2015.

(51) Int. Cl.
*H04N 5/225* (2006.01)
*H01L 27/146* (2006.01)
*H04N 5/374* (2011.01)
*H04N 5/355* (2011.01)

(52) U.S. Cl.
CPC .. *H01L 27/14614* (2013.01); *H01L 27/14643* (2013.01); *H04N 5/3559* (2013.01); *H04N 5/374* (2013.01)

(58) Field of Classification Search
None
See application file for complete search history.

(56) References Cited

U.S. PATENT DOCUMENTS

| | | | |
|---|---|---|---|
| 5,625,210 A | 4/1997 | Lee et al. | |
| 6,310,366 B1* | 10/2001 | Rhodes | H01L 27/14601 257/185 |
| 6,882,022 B2 | 4/2005 | Hynecek | |
| 7,109,537 B2 | 9/2006 | Dosluoglu et al. | |
| 7,238,993 B2 | 7/2007 | Dosluoglu et al. | |
| 2005/0110884 A1* | 5/2005 | Altice, Jr. | H01L 27/14603 348/302 |
| 2009/0219418 A1* | 9/2009 | Fujita | H01L 27/14609 348/243 |
| 2009/0256230 A1* | 10/2009 | Watanabe | H01L 27/14603 257/435 |

(Continued)

*Primary Examiner* — Twyler L Haskins
*Assistant Examiner* — Dwight Alex C Tejano
(74) *Attorney, Agent, or Firm* — Treyz Law Group, P.C.; Michael H. Lyons; David K. Cole

(57) ABSTRACT

An image sensor may include an array of image sensor pixels. Each pixel may have a photodiode, a floating diffusion node, and a charge transferring transistor. The charge transferring transistor may be a dual gate transistor having first and second gate terminals. A suitable bias may be applied to the second gate terminal to alter the capacitance of the floating diffusion node. The amount of electrons that may be accommodated by the floating diffusion node may be altered with application of a varying voltage level bias at the second gate terminal. By implementing a dual gate transistor, dynamic range compression and anti-blooming charge overflow may be implemented directly in the pixel to reduce image sensor pixel size and cost.

17 Claims, 4 Drawing Sheets

(56) References Cited

U.S. PATENT DOCUMENTS

| | | | | |
|---|---|---|---|---|
| 2011/0205416 A1* | 8/2011 | Nishihara | ......... | H01L 27/14609 348/300 |
| 2011/0248371 A1* | 10/2011 | Matsumura | ....... | H01L 27/14612 257/443 |
| 2012/0104464 A1* | 5/2012 | Janesick | ................ | H01L 21/84 257/223 |
| 2013/0070131 A1* | 3/2013 | Ohkubo | ............ | H01L 27/14623 348/294 |
| 2015/0357363 A1* | 12/2015 | Kawamura | ....... | H01L 27/14818 257/229 |
| 2016/0013227 A1* | 1/2016 | Kim | .................. | H01L 27/14612 257/229 |

* cited by examiner

IMAGE SENSOR PIXELS HAVING DUAL GATE CHARGE TRANSFERRING TRANSISTORS

CROSS-REFERENCE TO RELATED APPLICATION(S)

This application claims priority to U.S. Provisional Application No. 62/241,862, filed on Oct. 15, 2015, entitled "Image Sensor Pixels Having Dual Gate Charge Transferring Transistors," invented by Jaroslav Hynecek, and is incorporated herein by reference and priority thereto for common subject matter is hereby claimed.

BACKGROUND

This relates to solid-state image sensor arrays and, more specifically, to complementary metal-oxide semiconductor (CMOS) image sensor arrays that are illuminated from the back side or the front side of a corresponding image sensor substrate. The image sensor pixels have incorporated therein a mechanism to drain overflow charge away from the image sensor pixels, thereby preventing charge from spilling into neighboring pixels in the array when a particular pixel or a group of pixels is overexposed. The invention describes in detail a charge transferring gate structure resulting in an improved overflow charge control that is particularly suitable for small size pixels illuminated from the back side of the substrate. The new transfer gate structure allows introducing the signal dynamic range compression directly into the pixel.

Typical image sensors sense light by converting impinging photons into electrons (or holes) that are integrated (collected) in sensor pixels. Upon completion of each integration cycle, the collected charge is converted into voltage signals, which are supplied to corresponding output terminals associated with the image sensor. Typically, this charge-to-voltage conversion is performed directly within the pixels, and the resulting analog pixel voltage signals are transferred to the output terminals through various pixel addressing and scanning schemes. The analog pixel voltage signals can sometimes be converted on-chip to a digital equivalent before being conveyed off-chip. Each pixel includes a buffer amplifier (i.e., source follower) that drives output sensing lines that are connected to the pixels via respective addressing transistors.

After charge-to-voltage conversion is completed and after the resulting signals are transferred out from the pixels, the pixels are reset before a subsequent new charge is accumulated. In pixels that include floating diffusions (FD) serving as a charge detection node, this reset operation is accomplished by momentarily turning on a reset transistor that connects the floating diffusion node to a voltage reference (typically the pixel source follower current drain node) for draining (or removing) any charge transferred onto the floating diffusion node. However, removing charge from the floating diffusion node using the reset transistor generates thermal kTC-reset noise. This kTC reset noise is removed using correlated double sampling (CDS) signal processing techniques in order to achieve desired low noise performance. Typical CMOS image sensors that utilize CDS require three transistors (3T) or four transistors (4T) per pixel, one of which serves as a charge transferring transistor. It is possible to share some of the pixel circuit transistors among several photodiodes, which also reduces the pixel size.

It is typically necessary for image sensors to simultaneously satisfy three requirements. In particular, image sensors need to accumulate holes to reduce dark current, provide an efficient blooming control, and guarantee complete charge transfer from the photodiode when the transfer gate is turned fully on. These three requirements are not easily satisfied simultaneously, which typically results in some pixel performance sacrifice. Another problem is that once the pixel is designed and manufactured with a particular transfer gate length and doping levels, the blooming performance of the pixel is fixed and cannot be changed. This typically results in some sacrifice of the pixel charge well capacity that has to be built into the pixel to serve as a margin for effective anti-blooming operations.

It would therefore be desirable to be able to provide improved image sensor pixel designs.

DETAILED DESCRIPTION

Figure 1:
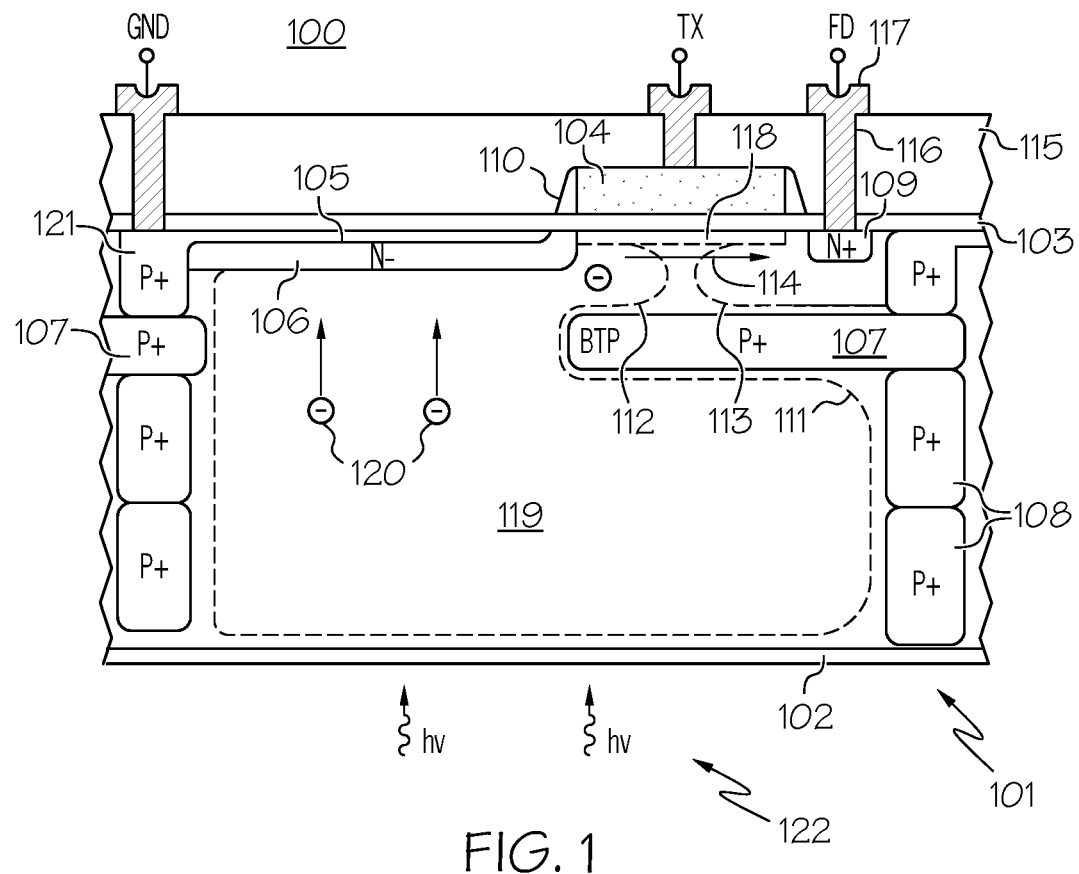
FIG. 1 is an example of a simplified cross-sectional side view of an image sensor pixel consisting of a photodiode, a charge transfer gate, a floating diffusion, a retrograde doped BTP p-well, a p+ dark current back side quenching layer, and pixel isolation implants.

FIG. 1 shows a simplified circuit diagram of a pixel 100 in one arrangement of a CMOS image sensor. The diagram of FIG. 1 illustrates pixel regions such as the pixel photodiode that collects photon-generated carriers, the charge transferring (Tx) gate 104 of the charge transferring transistor, and the floating diffusion (FD) 109. Pixel 100 may be fabricated within substrate 101, which has a p+ type doped layer 102 deposited on the back side surface of the substrate. Layer 102 may prevent generation of excessive dark current by the interface states. The device substrate may further include epitaxial p− type doped layer 119 situated above p+ type doped layer 102. Photons 122 that enter this region may generate charge carriers 120 that are collected in the potential well of the photodiode (PD) formed in region 106. The surface of epitaxial layer 119 may be covered by oxide layer 103 that isolates doped poly-silicon charge transferring gate 104 from the substrate. Poly-silicon gate 104 may have spacers 110 formed at the gate edges that serve as a patterning mask separating the edge of p+ type doped photodiode pinning implant 105 from the n-type doped implant 106 in which the potential well for storing electrons is formed.

The photodiode may be formed by n− type doped layer 106 and p+ type doped potential pinning layer 105 which, similar to p+ type doped layer 102, also reduces interface states generated dark current. Pinning layer 105 may extend to the edge of the pixel and may join with p+ type doped pixel separation implant region 121. The complete pixel separation may be further accomplished by p+ type (BTP) retrograde doped layer 107, which extends under transfer gate 104 and under floating diffusion 109, and by implants 108 that extend all the way to the bottom of the pixels and join with p+ type doped layer 102. The photodiode bulk depletion region is indicated in FIG. 1 by dashed line 111. Floating diffusion diode 109 senses charge transferred from the photodiode and may be connected to the pixel source follower transistor gate (not shown in FIG. 1 for the sake of drawing simplicity). The floating diffusion, the source follower, and the remaining pixel circuit components may all be built into the p-type doped well with retrograde p+ type doped BTP region 107 that diverts the photon generated carriers into the photodiode potential well located in layer 106, and thus prevents their loss. The whole pixel may be covered by several inter-level (IL) oxide layers 115 (only one of which is shown in FIG. 1 for the sake of drawing simplicity) that are used for the pixel metal wiring and interconnect isolation. The pixel active circuit components may be connected to the wiring by metal via plugs 117 deposited through contact holes 116.

Blooming control in pixel 100 may be accomplished in several ways, such as by continuously pulsing the charge transferring gate 104 from an off state to a partial on state to drain off some of the accumulated charge (which has already almost filled the photodiode well) to floating diffusion 109, and from floating diffusion 109 through the reset means to the pixel source-follower drain node. Another method of blooming control is to form a buried channel region under charge transferring gate 104 between the photodiode n− type doped layer 106 that is integrating charge and floating diffusion region 109. This buried channel may be built above p+ type doped BTP layer 107 by a suitable n-type doped implant or may be formed naturally when floating diffusion 109 and layer 106 are sufficiently close together. The current path for the overflow electrons is shown in FIG. 1 by arrow 114. This path may occur at the location where depletion region 112 from n-type doped photodiode region 106 is closest to floating diffusion depletion region 113.

Figure 2:
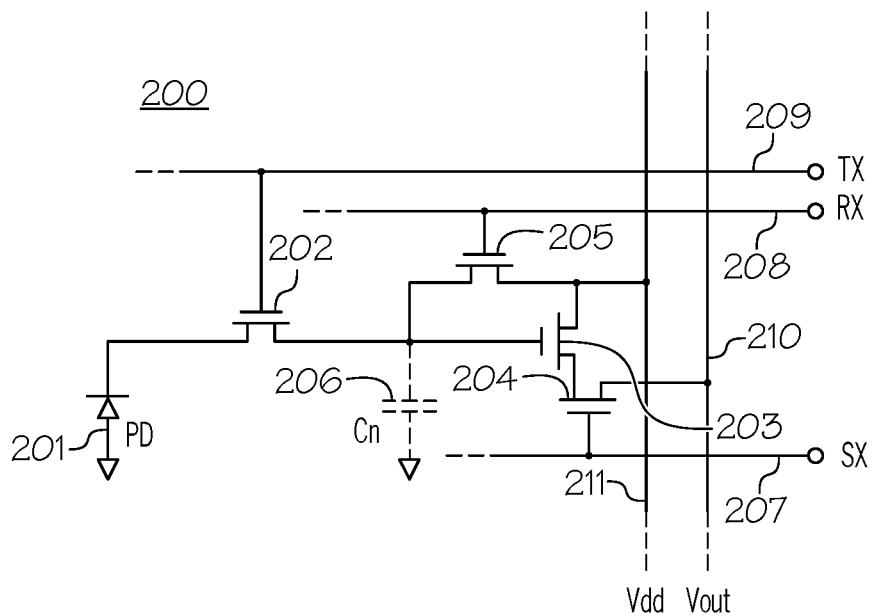
FIG. 2 is a circuit diagram of a pixel of the type shown in FIG. 1.

FIG. 2 shows an equivalent circuit diagram 200 of the pixel 100 shown in FIG. 1. As shown in FIG. 2, photodiode 201 accumulates the photon generated charge and may be connected to floating diffusion node 206 (shown as capacitor Cn) by charge transferring transistor 202. It is also possible to connect several photodiodes and several charge transferring transistors to the same charge detection node. Floating diffusion node 206 may be connected to the gate of source follower transistor 203 which has a drain that is connected to column Vdd drain bias line 211. The source of source follower transistor 203 may be connected through row select transistor 204 to column sense line 210. Floating diffusion node 206 may be reset by reset transistor 205 that is connected between floating diffusion node 206 and column drain bus 211. The gate of charge transferring transistor 202 may receive charge transfer control signals from row bus line 209, the gate of reset transistor 205 may receive reset control signals from row bus line 208, and the gate of addressing transistor 204 may receive addressing control signals from row bus line 207.

Figure 3:
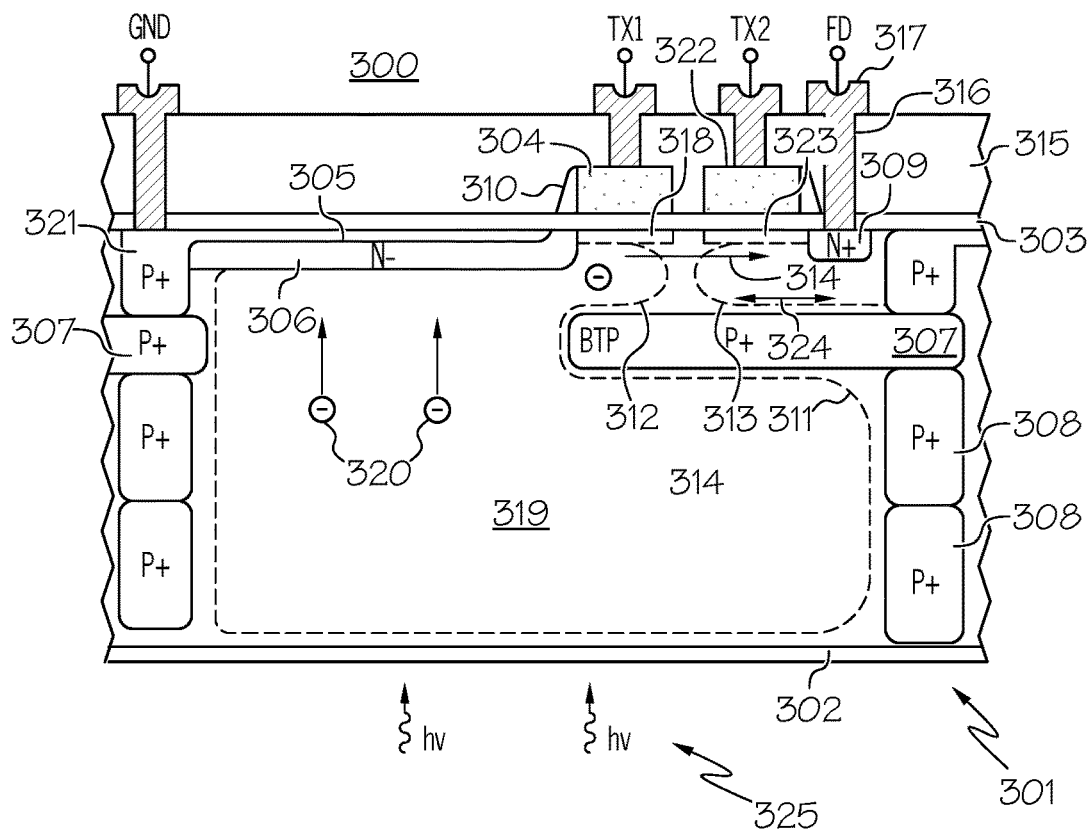
FIG. 3 is a cross-sectional side view of an illustrative pixel having a dual gate charge transfer transistor structure that provides modulation of the punch-through potential based on a second transfer gate bias in accordance with an embodiment.

A simplified cross sectional diagram of an illustrative image sensor pixel of one invention embodiment is shown in FIG. 3. As shown in FIG. 3, image sensor pixel 300 may include a pixel photodiode that collects photon generated carriers, a floating diffusion such as floating diffusion node 309, and a dual gate charge transfer transistor that includes a first charge transferring gate 304 and a second charge transferring gate 322. First charge transferring gate 304 may receive a first charge transfer control signal Tx1 whereas second charge transferring gate 322 receives a second charge transfer control signal Tx2. The pixel may be fabricated within substrate 301, which may include p+ type doped layer 302 deposited on a back side surface. This layer may prevent the generation of excessive dark current by the interface states. The device substrate may further include epitaxial p− type doped layer 319 situated above p+ type doped layer 302. Photons 325 that enter this region may generate carriers 320 that are collected in the potential well of the photodiode formed in region 306. The surface of epitaxial layer 319 may be covered by oxide layer 303 which isolates the doped poly-silicon charge transferring gates 304 and 322 from the substrate. The poly-silicon gates may have spacers 310 formed at the gate's edges that serve as a patterning mask separating the edge of the n+ type doped floating diffusion region from the charge transferring gate 322 and separating the edge of p+ type doped photodiode pinning implant 305 from n− type doped implant 306 (e.g., where the potential well for storing electrons is formed).

The photodiode may be formed by n− type doped layer 306 and p+ type doped potential pinning layer 305. Similarly to p+ type doped layer 302, p+ type doped potential pinning layer 305 may reduce interface states generated dark current. Pinning layer 305 may extend to the edge of the pixel and join with p+ type doped pixel separation implants 321. Complete pixel separation may be further accomplished by p+ type (BTP) retrograde doped layer 307 and implants 308. P+ type retrograde doped layer 307 may extend under transfer gate 304, transfer gate 322, and under floating diffusion 309. Implants 308 may extend all the way to the bottom of the pixels and join with p+ type doped layer 302. The photodiode bulk depletion region is indicated in pixel 300 by dashed line 311. Floating diffusion 309 may sense charge transferred from the photodiode and may be connected to the pixel source follower transistor gate (not shown in FIG. 3 for the sake of drawing simplicity). The floating diffusion, the source follower, and the remaining pixel circuit components may be built in the p-type doped well which may include retrograde p+ type doped region 307. Retrograde p+ type doped region 307 may divert the photon generated charge into the photodiode potential well located in layer 306 and thus prevent their loss. The whole pixel may be covered by several inter-level (IL) oxide layers 315 (only one is shown in FIG. 3 for the sake of drawing simplicity) that may be used for the pixel metal wiring and interconnect isolation. The pixel active circuit components may be connected to the wiring by metal via plugs 317 deposited through contact holes 316.

Blooming control in pixel 300 may be accomplished by modulating the punch-through potential under transferring gates 304 and 322 by changing the bias of the second charge transferring gate 322 during the charge integration period. The current path for the overflow electrons is shown in the drawing by arrow 314 and may occur at the place where depletion region 312 from the photodiode is closest to depletion region 313 from the floating diffusion. The position of the edge of depletion region 313 may be shifted by the gate bias Tx2 as indicated by arrow 324. A larger distance between the depletion layer edges represents lower overflow current whereas a smaller distance between the depletion layer edges represents a higher overflow current. During the charge integration cycle, the interface between the silicon and silicon dioxide under the charge transferring gate 304 may be filled with holes as indicated by region 318. This may be necessary for the reduction of dark current. Accumulation of holes may be accomplished by a suitable negative charge transferring gate bias Tx1 and by a threshold shift implant.

Dynamic range compression in pixel 300 may be accomplished by providing a positive bias Tx2 for charge transferring gate 322 during readout. When a larger amount of charge is transferred onto the floating diffusion from the photodiode, the floating diffusion potential may be lowered from its reset level. When the floating diffusion potential becomes lower than the potential under the charge transferring gate 322, electrons from the floating diffusion may flow under this gate as indicated by region 323. This may cause the floating diffusion capacitance to increase and the corresponding charge conversion factor to decrease. It is thus possible to select a suitable DC bias for the charge transfer control signal Tx2 provided to gate 323 during the readout period (e.g., to control the potential and the number of electrons at which the pixel conversion gain changes from its high level to a lower level). This is shown in more detail in FIG. 5.

Figure 4:
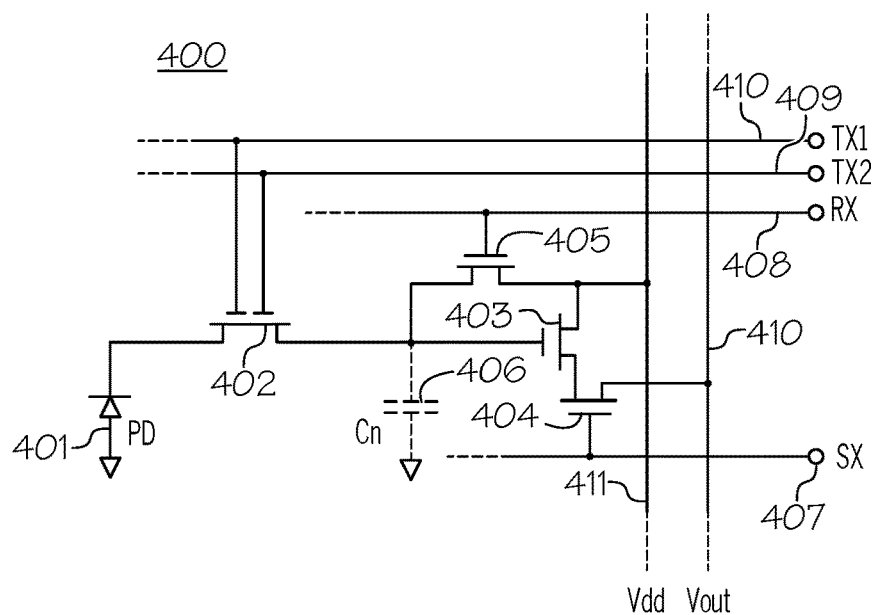
FIG. 4 is a circuit diagram of a pixel of the type shown in FIG. 3 in accordance with an embodiment.

A simplified circuit diagram of an illustrative image sensor pixel such as pixel 300 of FIG. 3 is shown in FIG. 4. As shown in FIG. 4, photodiode 401 that accumulates the photon generated charge may be connected to the floating diffusion node 406 (shown as capacitor Cn) by the charge transferring transistor 402. Transistor 402 may be a dual gate charge transferring transistor having first and second charge transferring gates that receive control signals Tx1 and Tx2 respectively. It may also be possible to connect several photodiodes and several charge transferring transistors to the same charge detection node using the single gate charge transferring transistors or a dual gate charge transferring transistors. Floating diffusion node 406 may be coupled to the gate of the source follower transistor 403. The drain of source follower transistor 403 may be coupled to column Vdd drain bias line 411. The source of source follower transistor 403 may be coupled through row select transistor 404 to column sense line 410. Floating diffusion node 406 may be reset by reset transistor 405 that is connected between floating diffusion node 406 and column drain bus 411. The gates of the charge transferring transistor 402 (e.g., gates 304 and 322 as shown in FIG. 3) may receive charge transfer control signals Tx1 and Tx2 over row bus lines 409 and 410 respectively. The gate of reset transistor 405 may receive reset control signals from row bus line 408. The gate of addressing transistor 404 may receive addressing control signals Sx over row bus line 407.

Figure 5:
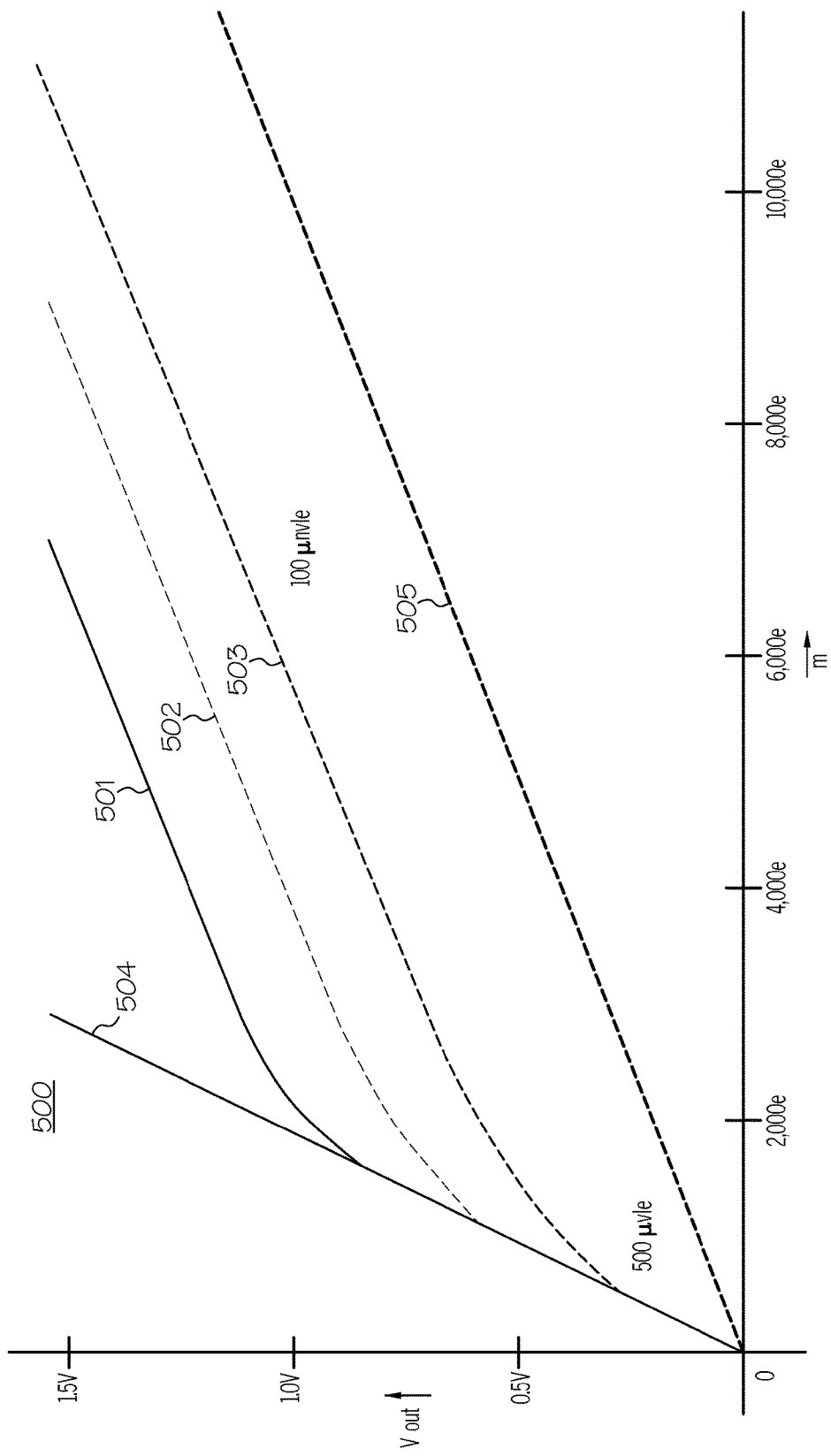
FIG. 5 is an illustrative graph showing the relationship between the number of electrons collected in a pixel photodiode of the type shown in FIGS. 3 and 4 and the corresponding output voltage from the pixel during charge readout in accordance with an embodiment.

FIG. 5 shows an illustrative graph 500 illustrating the relation between the number of electrons transferred from the photodiode onto the floating diffusion and the corresponding pixel output voltage change. As shown in FIG. 5, curve 501 represents the conversion gain characteristic of the pixel when charge transferring gate bias Tx2 is provided to second charge transferring gate 322 at a relatively low voltage level during readout. Curve 502 represents the conversion gain characteristic of the pixel when charge transfer gate bias Tx2 is provided to second charge transferring gate 322 at an intermediate voltage level that is greater than the relatively low voltage level during readout. Curve 504 represents the conversion gain characteristic of the pixel when charge transferring gate bias Tx2 is provided to second charge transferring gate 322 at a relatively high voltage level that is greater than the intermediate voltage level during readout. When the DC bias Tx2 applied to charge transferring gate 322 during a readout period is at its minimum level (e.g., the relatively low voltage level of curve 501), the floating diffusion may accommodate approximately 3000 electrons. When DC bias Tx2 is applied to charge transferring gate 322 at a relatively high level (e.g., as shown by curve 504), the floating diffusion may accommodate approximately 12,000 electrons. Curve 504 may represent the condition when charge transferring gate 322 is at its off biasing condition during readout. Line 505 may represent the condition when charge transferring gate 322 is at its fully on biasing condition during readout. These numbers are merely illustrative examples and may depend on the particular charge transferring gate design.

Figure 6:
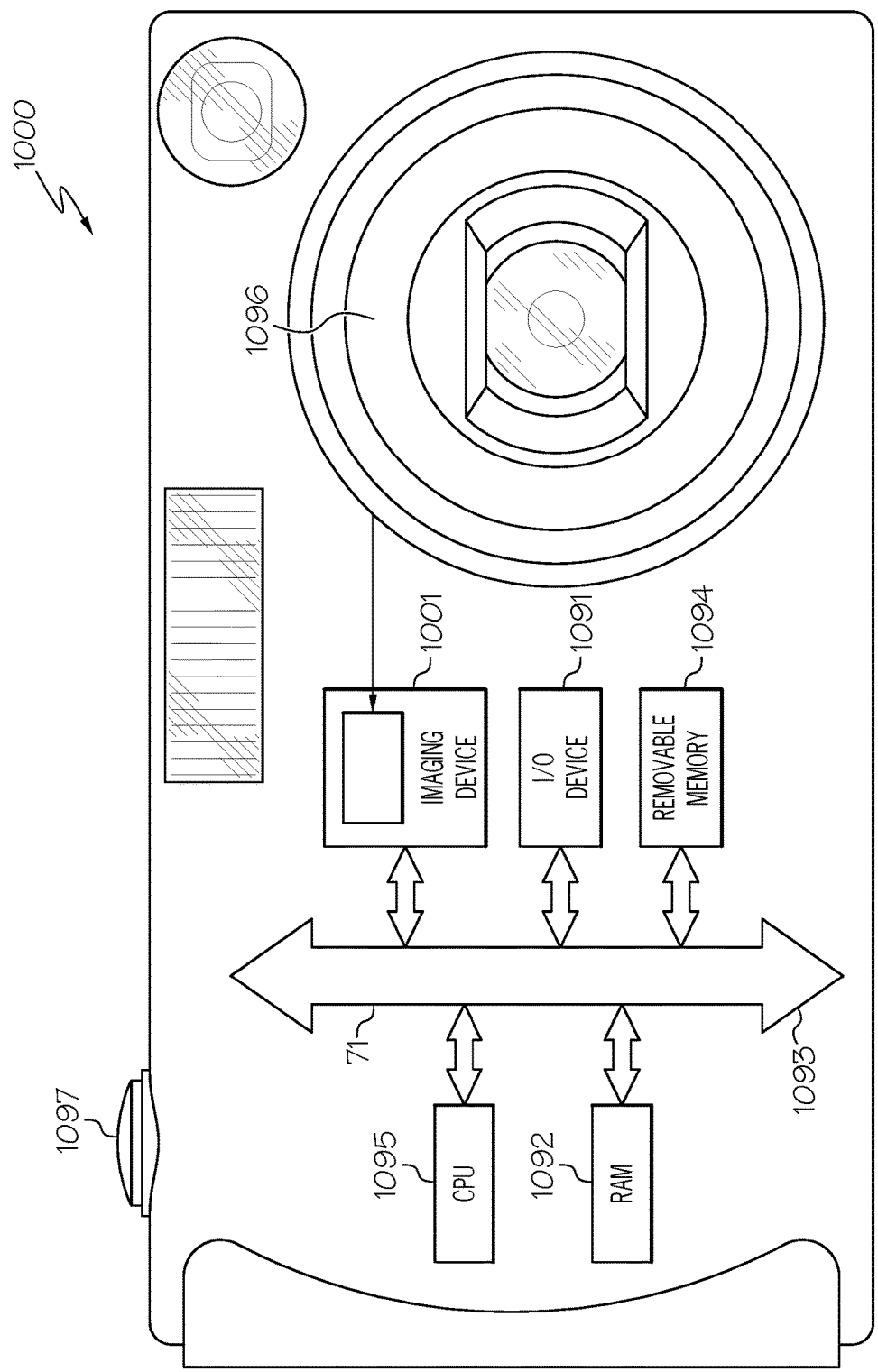
FIG. 6 is a block diagram of a processor system employing the image sensor pixels of FIGS. 3-5 in accordance with an embodiment.

FIG. 6 shows in simplified form a typical processor system 1000, such as a digital camera, which includes an imaging device such as imaging device 1001 (e.g., an imaging device 1001 such as an image sensor that includes pixels with dual gate charge transferring transistors as described above in connection with FIGS. 3-6). Processor system 1000 is exemplary of a system having digital circuits that could include imaging device 1001. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

Processor system 1000, which may be a digital still or video camera system, may include a lens such as lens 1096 for focusing an image onto a pixel array when shutter release button 1097 is pressed. Processor system 1000 may include a central processing unit such as central processing unit (CPU) 1095. CPU 1095 may be a microprocessor that controls camera functions and one or more image flow functions and communicates with one or more input/output (110) devices 1091 over a bus such as bus 1093. Imaging device 1001 may also communicate with CPU 1095 over bus 1093. System 1000 may include random access memory (RAM) 1092 and removable memory 1094. Removable memory 1094 may include flash memory that communicates with CPU 1095 over bus 1093. Imaging device 1001 may be combined with CPU 1095, with or without memory storage, on a single integrated circuit or on a different chip. Although bus 1093 is illustrated as a single bus, it may be one or more buses or bridges or other communication paths used to interconnect the system components.

Various embodiments have been described illustrating an imaging system (e.g., image sensor pixel array) which that has the capability of controlling anti-blooming by changing the bias of a second gate of a dual gate charge transferring transistor during the charge integration period, and that also has the capability of in-pixel dynamic range compression.

The image sensor pixel may include a photodiode that generates charge in response to image light, a floating diffusion node, and a charge transferring transistor configured to transfer the generated charge from the photodiode to the floating diffusion node. The charge transferring transistor may be a dual gate transistor having first and second gates (e.g., gate terminals).

The dual gate transistor may have a first gate adjacent to the photodiode and a second gate adjacent to the floating diffusion node. The first gate may be negatively biased to fill the interface between the silicon and silicon dioxide under the first gate with holes to reduce dark current. Blooming control in the image sensor pixel may be accomplished by modulating the punch-through potential under the gates of the charge transferring transistor and by changing the bias of the second charge transferring gate during the charge integration period.

A positive bias may be applied to the second gate of the charge transferring transistor to control the dynamic range of the image sensor pixel. A suitable bias may be provided to the second gate during the readout period to control the potential and the number of electrons at which the pixel conversion gain changes from its high to low level. The bias may cause electrons to flow under the second gate and alter the capacitance and charge conversion factor of the floating diffusion node.

The foregoing description is merely illustrative of the principles of this invention and various modifications can be made by those skilled in the art without departing from the scope and spirit of the invention. The foregoing embodiments may be implemented individually or in any combination.

What is claimed is:

1. An image sensor pixel, comprising:
   a photodiode that generates charge in response to image light;
   a floating diffusion node; and
   a charge transferring transistor having a first gate and a second gate, wherein the first gate and the second gate are controlled by respective first and second control lines, wherein the charge transferring transistor is configured to transfer the generated charge from the photodiode to the floating diffusion node, wherein the second control line is configured to modulate a bias applied to the second gate between at least three different voltages, wherein the at least three different voltages include a reset voltage, a transfer voltage, and an intermediate voltage, and wherein the intermediate voltage is dynamically adjusted while the generated charge is transferred from the photodiode to the floating diffusion node to change a conversion gain of the image sensor pixel.

2. The image sensor pixel defined in claim 1, wherein the second gate is interposed between the first gate and the floating diffusion node.

3. The image sensor pixel defined in claim 2, wherein the first gate is interposed between the second gate and the photodiode.

4. The image sensor pixel defined in claim 3, wherein the second gate is configured to alter a capacitance of the floating diffusion node in response to receiving a control signal from one of the respective control lines.

5. The image sensor pixel defined in claim 3, wherein the second gate is configured to receive a predetermined positive bias voltage that increases a capacitance of the floating diffusion node.

6. The image sensor pixel defined in claim 3, wherein a charge conversion factor of the floating diffusion node decreases in response to receiving a predetermined positive bias voltage at the second gate.

7. The image sensor pixel defined in claim 6, wherein a potential of the floating diffusion node is lowered from a reset level in response to generated charge being transferred to the floating diffusion node.

8. The image sensor pixel defined in claim 7, wherein electrons flow under the second gate when a potential of the floating diffusion node becomes lower than a potential of the second gate.

9. The image sensor pixel defined in claim 3, wherein the photodiode comprises a first depletion region having an edge, and wherein the floating diffusion node comprises a second depletion region having an edge.

10. The image sensor pixel defined in claim 9, wherein the second gate receives a control signal during a charge integration period that is configured to shift the edge of the second depletion region.

11. The image sensor pixel defined in claim 10, wherein a distance between the edge of the first depletion region and the edge of the second depletion region is decreased in response to receiving the control signal at the second gate.

12. The image sensor pixel defined in claim 10, wherein a distance between the edge of the first depletion region and the edge of the second depletion region is increased in response to receiving the control signal at the second gate.

13. A method of operating an imaging system having row control circuitry and an image sensor pixel, wherein the image sensor pixel comprises a photodiode, a floating diffusion node, and a charge transferring transistor having first and second gate terminals, the method comprising:
   with the photodiode, generating charge in response to image light;
   with the row control circuitry, controlling the first and second gate terminals of the charge transferring transistor to transfer the generated charge from the photodiode to the floating diffusion node, wherein controlling the first and second gate terminals comprises controlling each of the gate terminals in the charge transferring transistor using respective control paths;
   with the row control circuitry, applying a first voltage bias to the second gate terminal, wherein the floating diffusion node accommodates a first amount of electrons in response to the first voltage bias being applied to the second gate terminal;
   with the row control circuitry, applying a second voltage bias to the second gate terminal, wherein the second voltage bias is at a higher voltage level than the first voltage bias, wherein the floating diffusion node accommodates a second amount of electrons in response to the second voltage bias being applied to the second gate terminal, and wherein the second amount of electrons is greater than the first amount of electrons;
   dynamically selecting a third voltage bias to adjust a potential at which a pixel conversion gain changes from a high level to a low level; and
   with the row control circuitry, applying a third voltage bias to the second gate terminal, wherein the third voltage bias is at a higher voltage level than the first voltage bias and at a lower voltage level than the second voltage bias, wherein the floating diffusion node accommodates a third amount of electrons in response to the third voltage bias being applied to the second gate terminal, and wherein the third amount of electrons is less than the second amount of electrons and greater than the first amount of electrons.

14. The method defined in claim 13, wherein the second gate terminal is coupled between the floating diffusion node and the first gate terminal and the first gate terminal is coupled between the photodiode and the second gate terminal.

15. The method defined in claim 14 further comprising:
   with the row control circuitry, applying a negative voltage bias to the first gate terminal to accumulate holes at a silicon-silicon dioxide interface under the first gate terminal.

16. A system, comprising:
   a central processing unit;
   memory;

input-output circuitry; and
an imaging device, wherein the imaging device comprises:
 an array of image sensor pixels, and
 a lens that focuses an image onto the array, wherein a given one of the image sensor pixels comprises:
  a photodiode that generates charge in response to image light, wherein the photodiode comprises a first depletion region;
  a floating diffusion node having a second depletion region, wherein the second depletion region is separated from at least a portion of the first depletion region by a retrograde doped layer; and
  a charge transferring transistor having a first gate terminal and a second gate terminal, wherein the charge transferring transistor is configured to transfer the generated charge from the photodiode to the floating diffusion node, wherein a voltage applied to the second gate is modulated between at least three voltages to alter a dynamic range of the image sensor pixel, wherein the at least three different voltages include a first voltage, a second voltage and a third voltage, wherein the third voltage is higher than the first voltage and lower than the second voltage, and wherein the third voltage is dynamically adjusted while the generated charge is transferred from the photodiode to the floating diffusion node to change a conversion gain of the image sensor pixel.

17. The system defined in claim 16 wherein the photodiode comprises one of a plurality of photodiodes configured to generate charge in response to the image light, wherein the charge transferring transistor comprises one of a plurality of charge transferring transistors configured to transfer the generated charge from the plurality of photodiodes to the floating diffusion node.

\* \* \* \* \*